US012663708B2

(12) United States Patent
Hibbeler et al.

(10) Patent No.: US 12,663,708 B2
(45) Date of Patent: Jun. 23, 2026

(54) SYSTEM AND METHOD FOR REDUCING PELLICLE RUPTURE

(71) Applicant: Intel Corporation, Santa Clara, CA (US)

(72) Inventors: Lance C. Hibbeler, Tillamook, OR (US); John Ferdinand Magana, San Jose, CA (US); Chytra Pawashe, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1077 days.

(21) Appl. No.: 17/743,499

(22) Filed: May 13, 2022

(65) Prior Publication Data

US 2023/0367204 A1     Nov. 16, 2023

(51) Int. Cl.
| | |
|---|---|
| *G03F 1/64* | (2012.01) |
| *G01L 1/14* | (2006.01) |
| *G01L 1/16* | (2006.01) |
| *G01P 13/00* | (2006.01) |
| *G01P 15/00* | (2006.01) |

(52) U.S. Cl.
CPC ............... *G03F 1/64* (2013.01); *G01L 1/142* (2013.01); *G01L 1/16* (2013.01); *G01P 13/00* (2013.01); *G01P 15/00* (2013.01)

(58) Field of Classification Search
CPC ... G03F 1/64; G03F 1/62; G01L 1/142; G01L 1/16; G01P 13/00; G01P 15/00
See application file for complete search history.

(56) References Cited

U.S. PATENT DOCUMENTS

| | | | | |
|---|---|---|---|---|
| 6,834,549 | B2 * | 12/2004 | Shu | ........................... G03F 1/64 |
| | | | | 73/768 |
| 10,466,585 | B2 * | 11/2019 | Vles | ........................... G03F 1/62 |
| 2023/0367204 | A1 * | 11/2023 | Hibbeler | ................ G01P 15/00 |
| 2025/0076751 | A1 * | 3/2025 | Ha | ............................ G03F 1/62 |

FOREIGN PATENT DOCUMENTS

| | | | | | | |
|---|---|---|---|---|---|---|
| JP | H10144594 | A | * | 5/1998 | | |
| JP | 2002040628 | A | * | 2/2002 | .............. | G03F 1/84 |
| KR | 20180029384 | A | * | 3/2018 | .............. | G03F 1/62 |
| KR | 20190141986 | A | * | 12/2019 | .............. | G03F 1/80 |
| KR | 20200141913 | A | * | 12/2020 | .............. | G03F 7/16 |
| WO | WO-2024204105 | A1 | * | 10/2024 | .............. | G03F 1/62 |

* cited by examiner

*Primary Examiner* — Octavia Hollington
(74) *Attorney, Agent, or Firm* — Viering, Jentschura & Partner mbB

(57) ABSTRACT

A reinforcement system includes a framed pellicle, which includes a center part of a pellicle surrounded by a peripheral part of the pellicle, wherein the peripheral part is adhered to a pellicle frame; and an edge reinforcement for reinforcing the framed pellicle, positioned at a boundary between the center part of the framed pellicle and the pellicle frame.

19 Claims, 13 Drawing Sheets

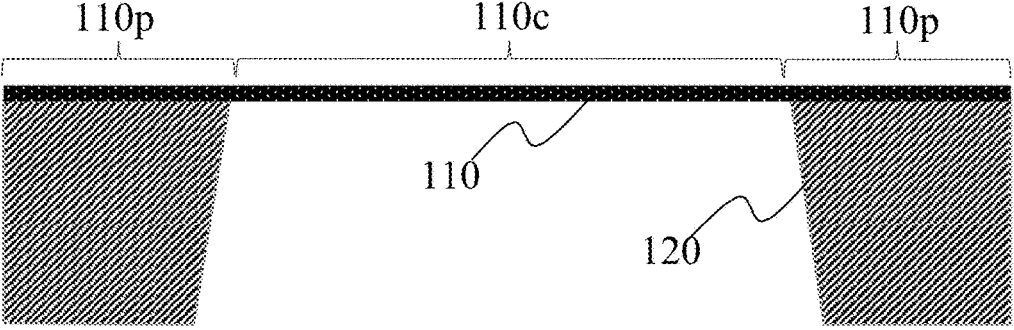
FIG. 1A
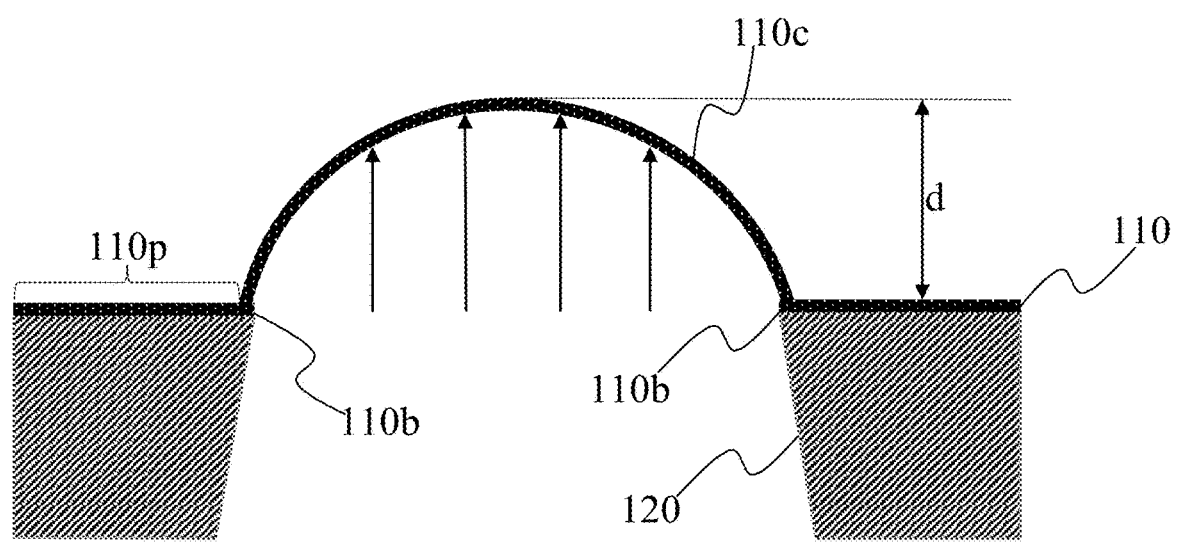
FIG. 1B

400

430

420

410

430c

440

410

430c

420 r

500

600

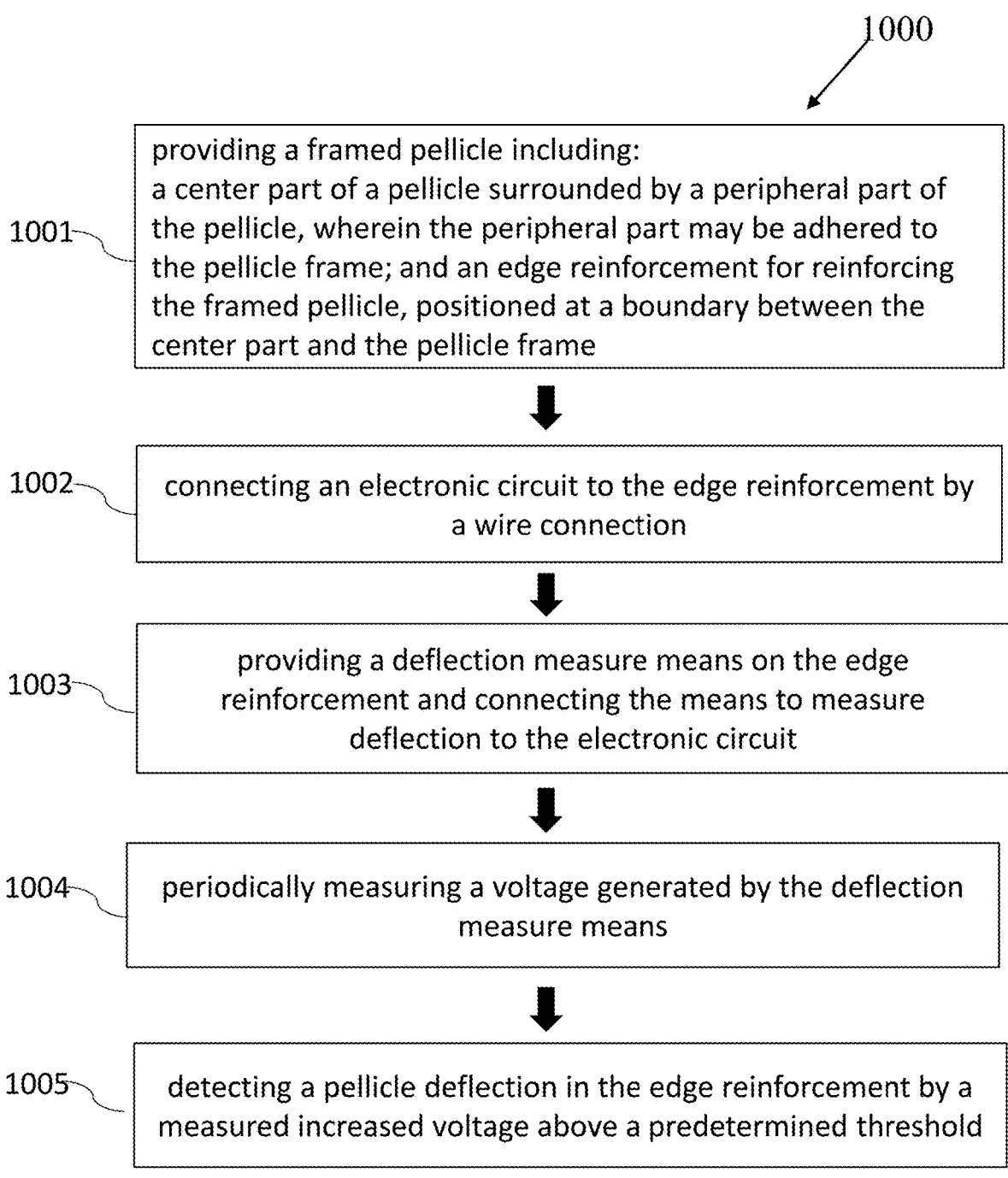

1000

1001 — providing a framed pellicle including:
a center part of a pellicle surrounded by a peripheral part of the pellicle, wherein the peripheral part may be adhered to the pellicle frame; and an edge reinforcement for reinforcing the framed pellicle, positioned at a boundary between the center part and the pellicle frame 1002 — connecting an electronic circuit to the edge reinforcement by a wire connection 1003 — providing a deflection measure means on the edge reinforcement and connecting the means to measure deflection to the electronic circuit 1004 — periodically measuring a voltage generated by the deflection measure means 1005 — detecting a pellicle deflection in the edge reinforcement by a measured increased voltage above a predetermined threshold

FIG. 10

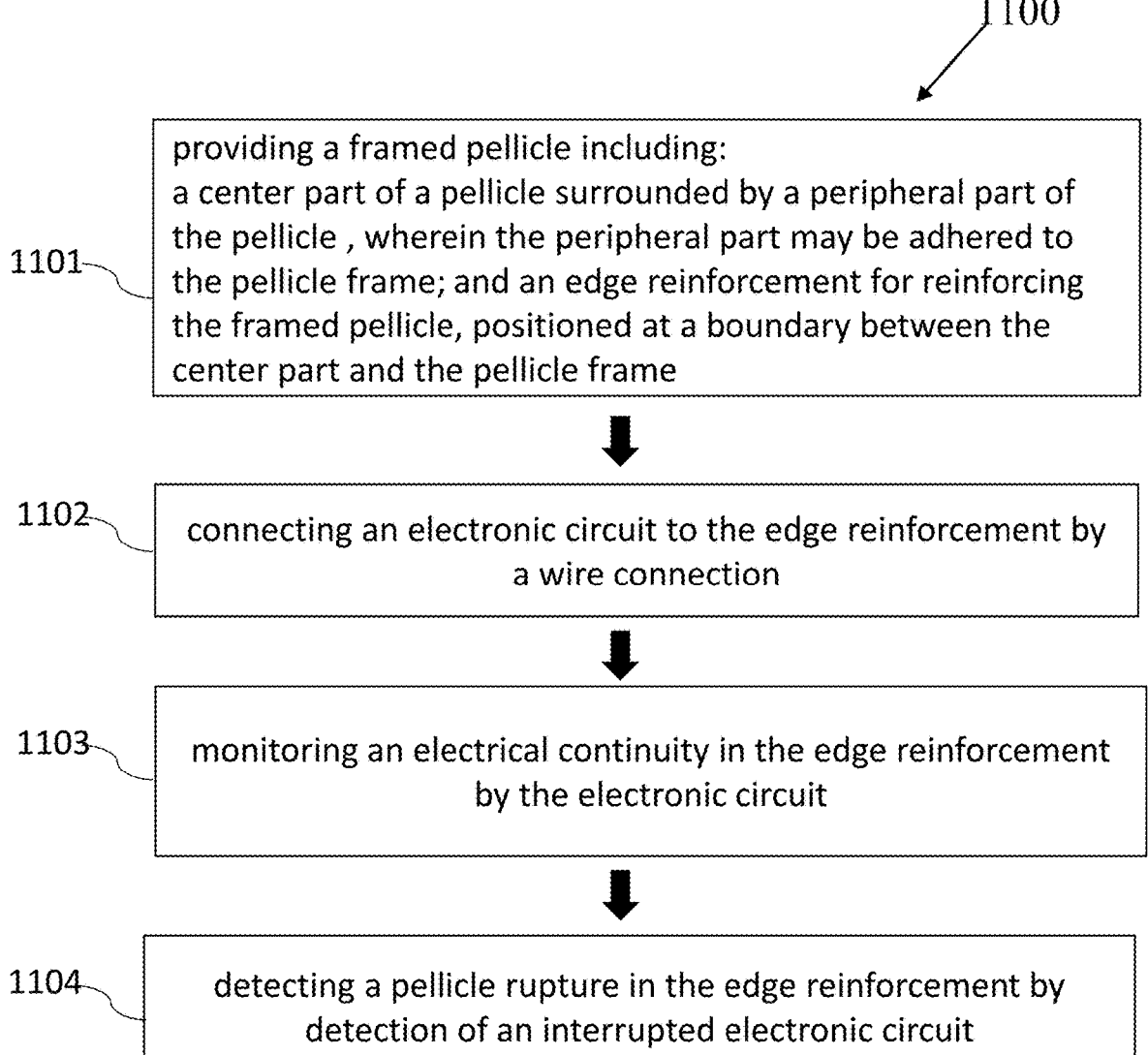

1100

1101 — providing a framed pellicle including:
a center part of a pellicle surrounded by a peripheral part of the pellicle , wherein the peripheral part may be adhered to the pellicle frame; and an edge reinforcement for reinforcing the framed pellicle, positioned at a boundary between the center part and the pellicle frame 1102 — connecting an electronic circuit to the edge reinforcement by a wire connection 1103 — monitoring an electrical continuity in the edge reinforcement by the electronic circuit 1104 — detecting a pellicle rupture in the edge reinforcement by detection of an interrupted electronic circuit

FIG. 11

SYSTEM AND METHOD FOR REDUCING PELLICLE RUPTURE

BACKGROUND

A pellicle is a thin transparent membrane that protects a photomask during chip production flow, e.g., during extreme ultraviolet (EUV) photolithography. The pellicle is mounted on the photomask and prevents particles from falling on the photomask during the production process. The pellicle is positioned at a distance from the photomask which renders particles on the pellicle out of focus and thus not printable on a wafer.

Occasionally, the pellicle breaks or ruptures and this causes the particles of the pellicle to be dispersed in the EUV photolithography system. The particles contaminate the environment of the EUV photolithography system and introduce defects into a pattern projected on a semiconductor substrate. If the pellicle were to break in the stages of the EUV photolithography system immediately preceding the EUV exposure stage, then it would be difficult to detect the pellicle damage. Such a damaged pellicle would then travel through the EUV photolithography system to the EUV exposure stage, and particles from the damaged pellicle may contaminate all the stages of the EUV photolithography system that the damaged pellicle passes through. The subsequent clean-up and restore operations for bringing the EUV photolithography system back online will cause operational disruption and inefficiency.

Accordingly, during an EUV photolithography process, a major potential source of operational inefficiency may be attributed to ruptured pellicles and late detection of such ruptured pellicles. This major source of operational inefficiency may need to be addressed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 1A schematically shows a framed pellicle in a cross sectional view without pressure applied and without deflection;

FIG. 1B schematically shows a framed pellicle in a cross sectional view with pressure applied and with deflection;

FIG. 10 shows a simplified flow diagram for an exemplary method of monitoring a pellicle deflection according to an aspect of the present disclosure;

FIG. 11 shows a simplified flow diagram for an exemplary method of determining a pellicle rupture according to an aspect of the present disclosure.

DETAILED DESCRIPTION

Figures 2A, 2B:
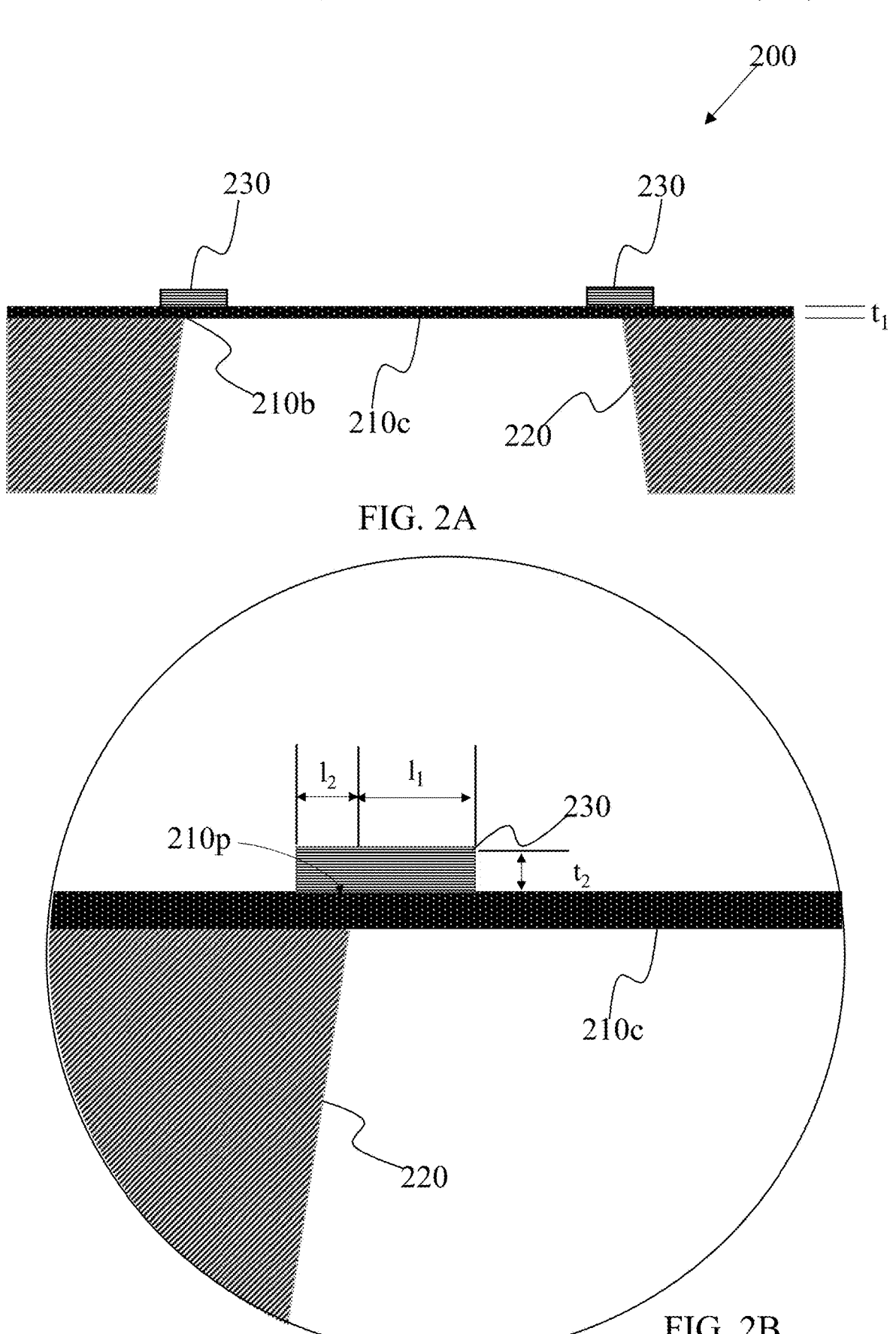
FIG. 2A schematically shows one aspect of a reinforcement system according to the present disclosure in a cross sectional view without pressure applied and without deflection.
FIG. 2B shows an enlarged section of FIG. 2A.

In order to solve the above stated problems, enhancement of mechanical strength in the regions of highest stress may be required to ensure durability of pellicles under a wide variety of operating conditions. These operating conditions include, e.g., air transport, atmospheric pressure changes, pressurized dry nitrogen purge container storage, scanner mask stage acceleration or electrostatic chucking, pump and venting cycles in a scanner or various metrology tooling (e.g., actinic pattern mask inspection, phase measurement apparatus, EUV reflectometer, etc.). The operating conditions create localized stress concentrations in a peripheral part of the pellicle due to deformation (e.g., deflection) associated with pellicle stretching/bulging under an applied force (e.g., an applied pressure). For example, during pump-down and venting, the pellicle may be subjected to bulging in convex and concave directions with respect to the pellicle's x-y plane. Similarly, during scanning with illumination a pressure wave may be generated under the scanner slit.

The effect of these pressure changes is shown, for example, in the system 100 of FIG. 1A and FIG. 1B. A framed pellicle 110 may have two parts, one section may be a center part of a pellicle 110c, the other part may be a peripheral part 110p where the framed pellicle 110 is disposed on (i.e. adhered to by means of deposition technologies well known to those skilled in the art of thin film growth) a pellicle frame 120. In other words, the center part of the pellicle 110c may be surrounded by a peripheral part of the pellicle 110p adhered to the pellicle frame 120. Without any pressure applied to the system 100, the surface of the framed pellicle is substantially a straight line and no significant stress is assumed to apply to the framed pellicle 110. Under the influence of applied pressure (see, FIG. 1B, arrows), the part of the framed pellicle 110 that is not adhered to the pellicle frame 120, i.e. the center part of the framed pellicle 110c, may stretch or bulge, causing deflection in the framed pellicle 110, identified as a displacement d. The edge where the framed pellicle 110 starts to bulge may be identified as a boundary 110b, and at this boundary 110b, the stress applied to the framed pellicle 110 is the highest, occasionally causing the framed pellicle 110 to rupture. In other words, because the framed pellicle 110 undergoes abrupt transition from the horizontal plane at the boundary 110b when subjected to a mechanical force (e.g., pressure), there is a high concentration of stress in this region. When this stress exceeds the rupture strength of the framed pellicle 110, failure may occur (i.e., the framed pellicle 110 may break).

With reference to FIG. 2A, a reduction in stress applied to the framed pellicle 210 at the boundary 210b is proposed. This reduction in stress may be realized by disposing an edge reinforcement 230 that is positioned at the boundary 210b between the center part of the framed pellicle 210c and the pellicle frame 220. Advantageously, analytical simulation studies of mechanical properties of typical nanoscale EUV pellicles (e.g., stress under uniform pressure) suggest that an edge reinforcement 230 positioned at the boundary 210b may result in significant (e.g., 7 to 8 times) reduction in stress with no effect to a maximum out-of-plane displacement or pellicle stress away from the reinforced boundary 210b. In turn, reduction in stress may reduce failures due to rupture of the framed pellicle 210 as well as increase the lifetime of the framed pellicle 210. More advantageously, since the reinforced boundary 210b may be out of the printable area (i.e., it is under the framing blades), there may be no impact on print performance. The edge reinforcement 230 may be applied to the framed pellicle 210 by a deposition technique and/or a subtractive patterning technique.

According to various aspects, and with reference to FIG. 2A and FIG. 2B, the edge reinforcement 230 may be applied to a top side of the framed pellicle 210, such that it contacts both the center part of the pellicle 210c and the peripheral part of the pellicle 210p that is adhered to the pellicle frame 220. In other words, in this aspect, the edge reinforcement 230 would not contact the pellicle frame 220. Advantageously, by positioning the edge reinforcement 230 to the top side of the framed pellicle 210, such that it contacts both the center part of the pellicle 210c and the peripheral part of the pellicle 210p that is adhered to the pellicle frame 220, the manufacturing of the reinforcement system 200 may be facilitated.

According to various aspects, the framed pellicle 210 may have a thickness $t_1$. According to various aspects, the edge reinforcement 230 may have a thickness $t_2$ that is higher than the thickness $t_1$ of the framed pellicle 210 (excluding the thickness of the pellicle frame 220). In particular, the thickness $t_2$ of the edge reinforcement 230 may be at least five times as high as the thickness $t_1$ of the framed pellicle 210, or approximately ten times as high as the thickness $t_1$ of the framed pellicle 210.

According to various aspects, the edge reinforcement 230 may be positioned such that a section of the center part of the pellicle 210c on which the edge reinforcement 230 is positioned may have a length $l_1$. The length $l_1$ may range approximately between 1 micrometers (μm) and 3 μm. Advantageously, in this range, the edge reinforcement 230 has a sufficient length for reinforcing the framed pellicle 210, while at the same time being out of the printable area for subsequent scanning processes.

According to various aspects, and with reference to FIG. 2A and FIG. 2B, the edge reinforcement 230 may be positioned such that a section of the peripheral part of the pellicle 210p on which the edge reinforcement 230 is positioned may have a length $l_2$. The length $l_2$ may range approximately between 1 μm and 10 μm. The length $l_2$ may be higher than the length $l_1$, since the length $l_2$ is not affected by printable area for subsequent scanning processes, but is merely limited by a length of the peripheral part of the pellicle 210p.

Figure 3A:
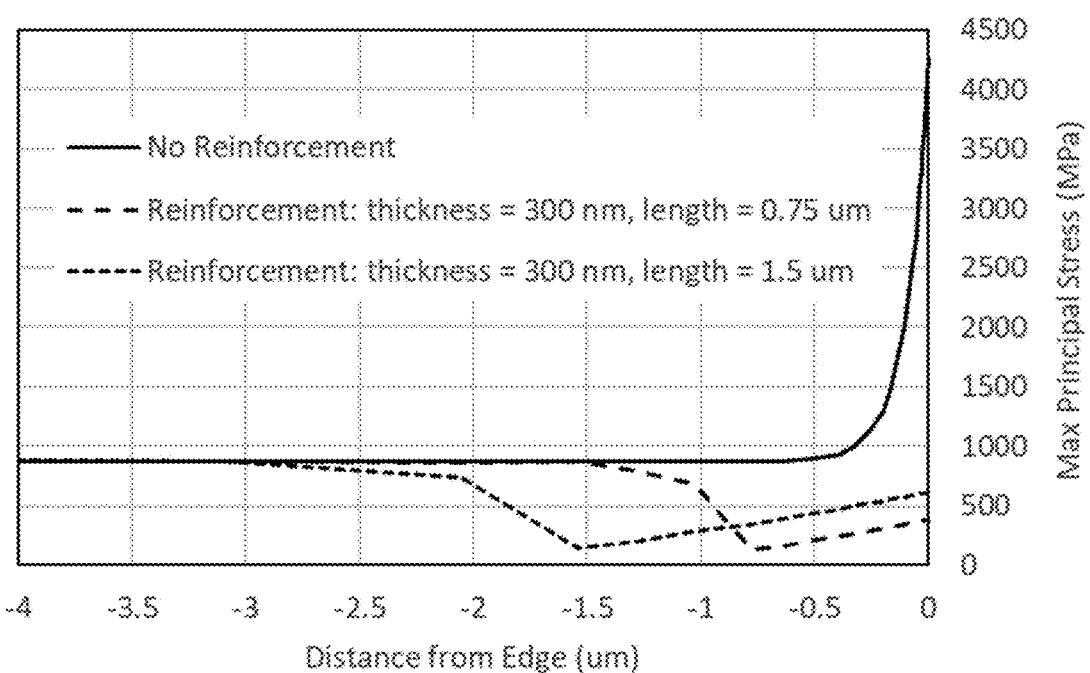
FIG. 3A is a graph showing a comparison between the stress that is applied on the pellicle without an edge reinforcement and with an edge reinforcement in two different thicknesses.

The efficiency of the reinforcement system of the present disclosure is shown in FIG. 3A. In particular, a graph in FIG. 3A shows the stress exerted on a framed pellicle for a distance of the center part of the pellicle from the edge (i.e. the distance from the boundary) for three different framed pellicles. In one example, the framed pellicle is in its original form, meaning that it is not reinforced, and the stress exerted on that framed pellicle is shown to increase exponentially with the proximity to the edge (i.e. to the boundary). In a second example, the framed pellicle is reinforced such that a thickness of the framed pellicle and the edge reinforcement is together 300 nanometers (nm), i.e., the thickness of the framed pellicle is 10% of the thickness of a sum of the framed pellicle and the edge reinforcement. The length $l_1$ of the edge reinforcement is 0.75 μm. In this second example, the stress exerted on that framed pellicle is shown to drop at about the point where the edge reinforcement is applied to the framed pellicle. In particular, at about 1 μm distance to the boundary, the stress exerted on that framed pellicle appears to drop, reaching its lowest value at about 0.75 μm distance to the boundary. In a third example, similar to the second example, the framed pellicle is reinforced such that a thickness of the framed pellicle and the edge reinforcement is together 300 nm. However, in this example, the length $l_1$ of the edge reinforcement is 1.5 μm. In this third example, the stress exerted on that framed pellicle is also shown to drop at about the point where the edge reinforcement is applied to the framed pellicle. In particular, at about 2 μm distance to the boundary, the stress exerted on that framed pellicle appears to drop, reaching its lowest value at about 1.5 μm distance to the boundary.

In brief, the stress reduction at the boundary 210b may be proportional to the thickness of the edge reinforcement. For example, with no edge reinforcement present, the maximum stress is 4200 megapascal (MPa), and at ten times the thickness of the framed pellicle, the maximum stress is a few hundred MPa, on par with the stress away from the boundary. Smaller values of the thicknesses for the edge reinforcement may not be as effective at reducing the stress. The minimum required thickness to avoid rupture depends on the loading conditions and the type of pellicle. In brief, the examples show the effectiveness of the reinforcement system in reducing the stress on the framed pellicle.

Figure 3B:
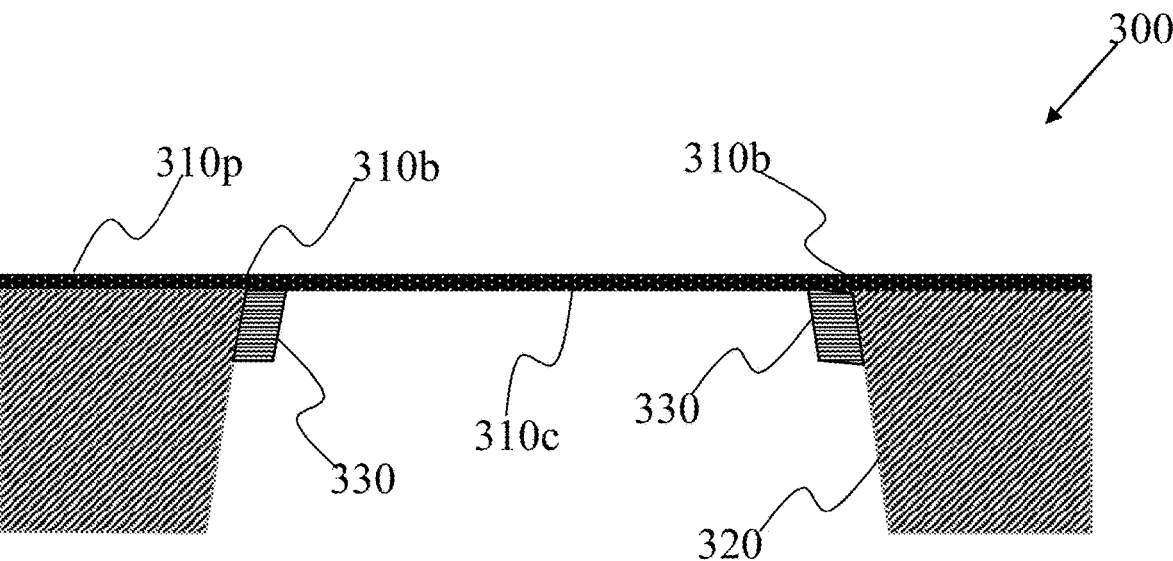
FIG. 3B schematically shows one aspect of a reinforcement system according to the present disclosure in a cross sectional view without pressure applied and without deflection.

With reference to FIG. 3B, according to various aspects, the edge reinforcement 330 may also be applied to a bottom side of the framed pellicle 310, such that it contacts both the center part of the pellicle 310c and the pellicle frame 320 at the boundary 310b. In other words, in this aspect, the edge reinforcement 330 would not contact the peripheral part of the framed pellicle 310p.

Figures 4A, 4B:
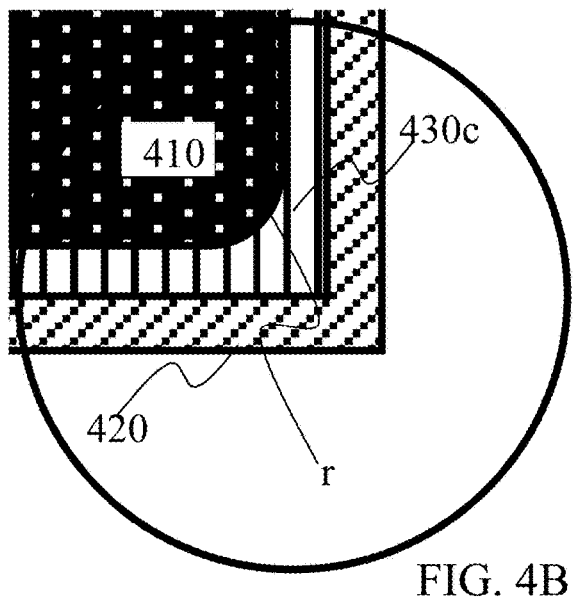
FIG. 4A schematically shows one aspect of a reinforcement system according to the present disclosure in a top view.
FIG. 4B shows an enlarged section of FIG. 4A.

In various aspects, as shown in FIG. 4A and FIG. 4B, the edge reinforcement 430 that is positioned at the framed pellicle 410 may have four corner reinforcements 430c on the pellicle frame 420. The corner reinforcements 430c may have an inner edge that is rounded off such that it is not a sharp edge but has the shape of a rounded down curved section with a radius r (see, enlarged view in FIG. 4B). Advantageously, such a rounded down inner edge in the edge reinforcement 430 of at least one of the four corner reinforcements 430c may help to minimize the stress in at least one of the four corner reinforcements 430c. Moreover, a thickness of the corner reinforcement 430c may be higher than a thickness of sections of the edge reinforcement 430 between the four corner reinforcements 430c, i.e. where the edge reinforcement may be substantially described as a straight line. Similarly, such a higher thickness in the corner reinforcements 430c may help to minimize the stress in at least one of the four corners. In an aspect, all four of the corners of the pellicle frame 420 may have corner reinforcements 430c.

In various aspects, the edge reinforcement 430 may be positioned to the boundary (not shown) completely surrounding the framed pellicle 410 on the pellicle frame 420. In other words, the edge reinforcement 430 may be in the shape of a quadrangular framework around the framed pellicle 410 without any gaps. Advantageously, since the edge reinforcement 430 may be completely surrounding the framed pellicle 410, it is possible to position electronic circuitry 440 in the edge reinforcement 430 and monitor electrical continuity of the edge reinforcement 430.

Figure 5A:
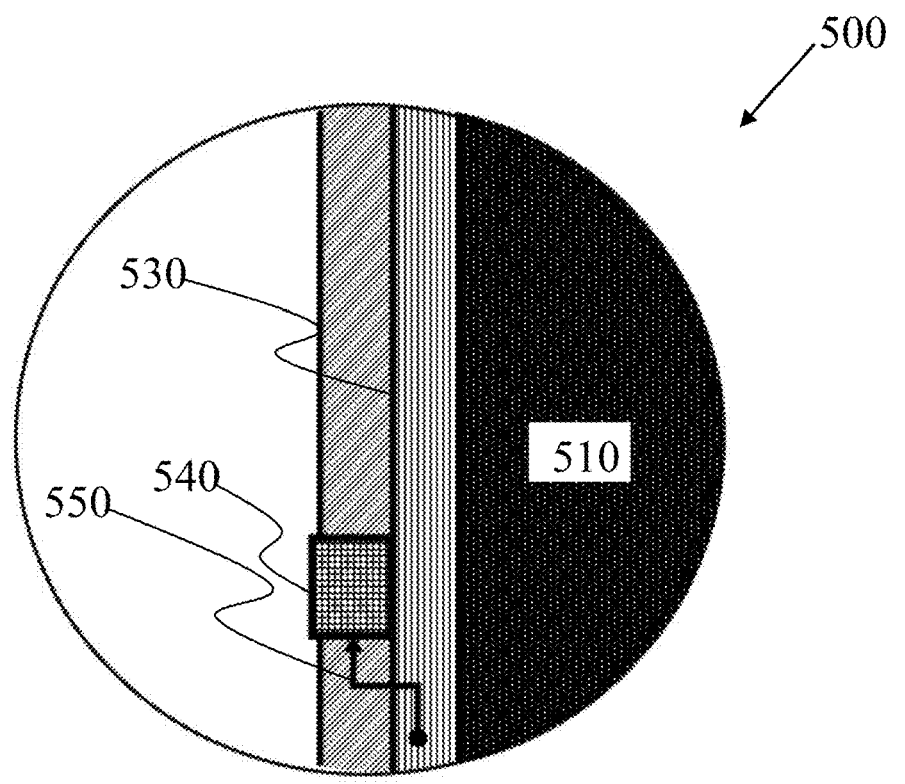
FIG. 5A schematically shows one aspect of a reinforcement system according to the present disclosure without a ruptured pellicle in a top view.
Figure 5B:
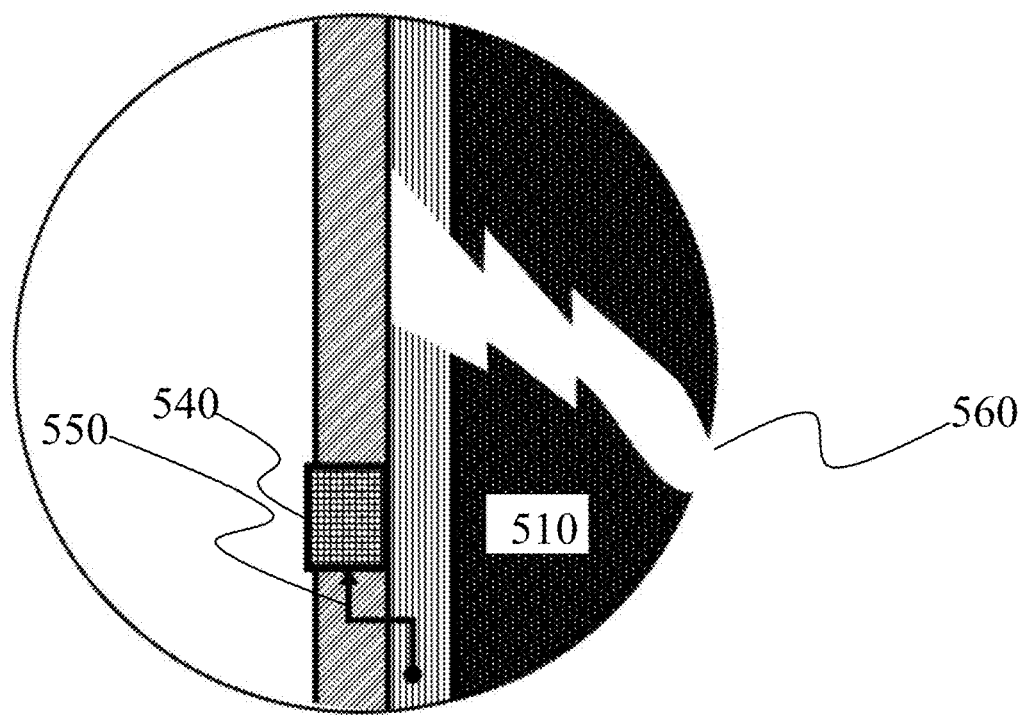
FIG. 5B schematically shows the aspect of a reinforcement system according to the present disclosure with a ruptured pellicle in a top view.

Accordingly, in some aspects, as shown in FIG. 5A, a reinforcement system 500 may include electronic circuitry 540 (e.g., on-board circuitry). The electronic circuitry 540 may be connected to the edge reinforcement 530. This connection may be realized by a wire connection 550 from the electronic circuitry 540 to the edge reinforcement 530 or other suitable means of electrical connection (e.g., typical integrated circuit metal interconnect). The electronic circuitry 540 may be configured to monitor electrical continuity in the edge reinforcement 530. With reference to FIG. 5B, in case of a rupture 560 in the framed pellicle 510, the edge reinforcement 530 would rupture at the same time, thereby breaking the electrical continuity in the edge reinforcement 530. A rupture in the framed pellicle 510 may accordingly be detected by an interrupted electrical circuit in the edge reinforcement 530. Communication (e.g., by wireless means) from the electronic circuitry 540 to an external device (e.g., an external computer, a scanner's controller, not shown) may initiate appropriate action in the event of a rupture in the framed pellicle 510. The appropriate action may include, e.g., stopping a scanner process, and/or removing a reticle from the inspection tooling, etc.

In some aspects, the electronic circuitry 540 may be affixed to the pellicle frame 520 by chip bonding techniques (e.g., ultrasonic bonding, eutectic solder bonding, epoxy bonding, etc.). Additionally or alternatively, the electronic circuitry 540 may be embedded in the pellicle frame 520 prior to assembling the pellicle frame 520 to the pellicle. Because the pellicle frame 520 may be commonly fabricated from a single crystal Silicon wafer, the electronic circuitry 540 may be fabricated directly in the Silicon using semiconductor processes well known to those skilled in the art. Additionally or alternatively, the electronic circuitry 540 may be affixed to a reticle (not shown).

For measuring the electrical continuity in the edge reinforcement 530, the edge reinforcement 530 may include a material that is conductive. Such material may be selected from the group consisting of a doped polysilicon, a doped single crystal silicon, a metal, a semiconductor, a metal alloy, or combinations thereof.

Electronic circuitry 540 can also be utilized to measure charge accumulation on the framed pellicle 510. Charging of pellicles is known to be a major source of failure (e.g., rupture) and thus having the ability to monitor charge would be highly advantageous for preventing and predicting charge induced failure modes.

Figure 6A:
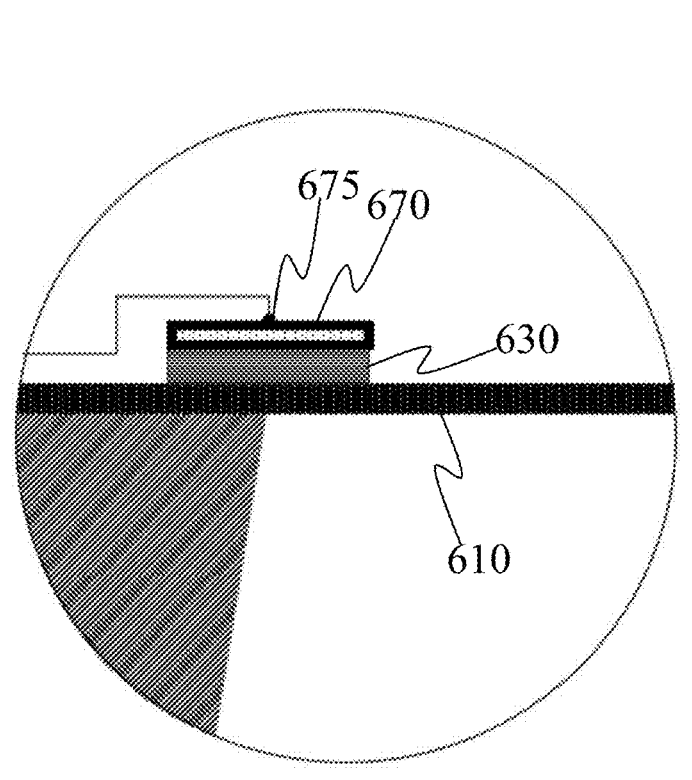
FIG. 6A schematically shows one aspect of a reinforcement system according to the present disclosure in a cross sectional view without deflection.
Figure 6B:
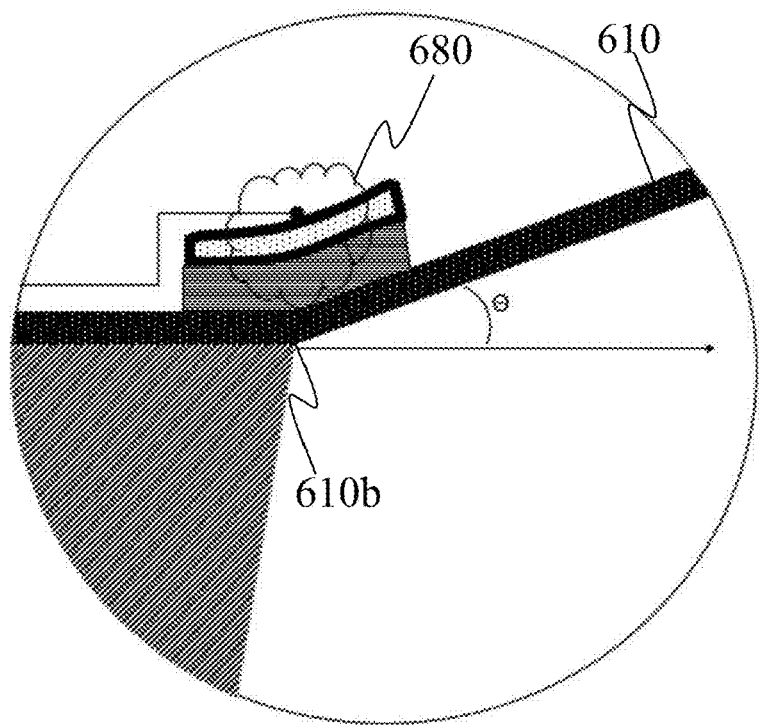
FIG. 6B schematically shows one aspect of a reinforcement system according to the present disclosure in a cross sectional view with deflection.

According to various aspects, with reference to FIG. 6A and FIG. 6B, a reinforcement system 600 may include means to measure deflection on the edge reinforcement 630. In one example, the means to measure deflection include a piezoelectric element 670 (e.g., $Pb(Zr,Ti)O_3$, PZT). The piezoelectric element 670 may be arranged to be in contact with the edge reinforcement 630 and connected to the electronic circuitry 640 using metal electrodes 675. The dimensions of the piezoelectric element 670 may be such that the piezoelectric effect may occur in response to applied mechanical stress, such as deflection of the edge reinforcement 630. The piezoelectric element 670 may be configured to be sufficiently flexible for not interfering with the bending (deflection) of the framed pellicle 610, but also may not be too flexible such that no signal is generated when the framed pellicle 610 is deflected. Designing the piezoelectric element 670 may be readily accomplishable by someone skilled in the art of piezoelectric sensor design and/or micro-electromechanical systems (MEMS). For example, the piezoelectric element 670 may be bonded to the edge reinforcement 630 by means of low temperature eutectic or other suitable methods (e.g., epoxy). Alternatively, the piezoelectric element 670 (e.g., a piezoelectric sensor element) may be fabricated directly on to the edge reinforcement 630 by means of conventional semiconductor processing methods.

Referring to FIG. 6B, when the framed pellicle 610 undergoes deflection of an angle Θ, the resultant mechanical stress concentrated at the boundary 610b may generate a voltage, e.g. a piezoelectric voltage. This voltage may be measured continuously. Alternatively, the voltage may be measured periodically, e.g., at a specific sampling frequency with a certain interval.

Figure 7A:
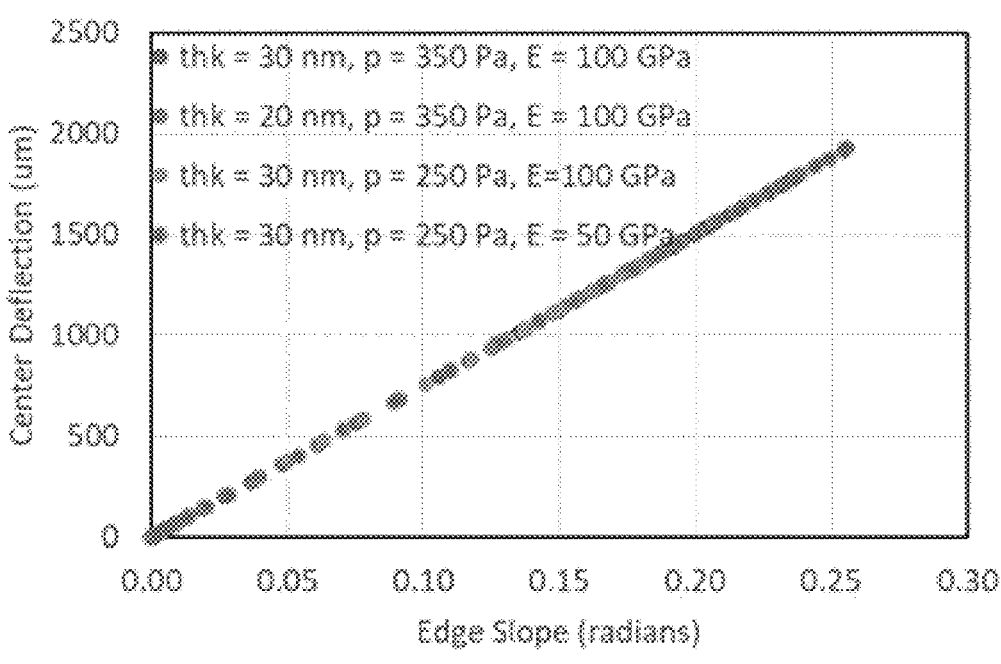
FIG. 7A is a graph showing a measured deflection for a measured edge slope.

The voltage (e.g., piezoelectric voltage) may be proportional to the displacement d (see, FIG. 1B) in the framed pellicle. As illustrated in FIG. 7A, mathematical evaluation of a maximum pellicle deflection as a function of slope near the boundary shows that there is a strong, approximately linear relationship between the maximum pellicle deflection and the slope near the boundary ("edge slope"), therefore an integrated strain gauge as a means for measuring deflection as proposed in the present disclosure is demonstrably feasible.

Figure 7B:
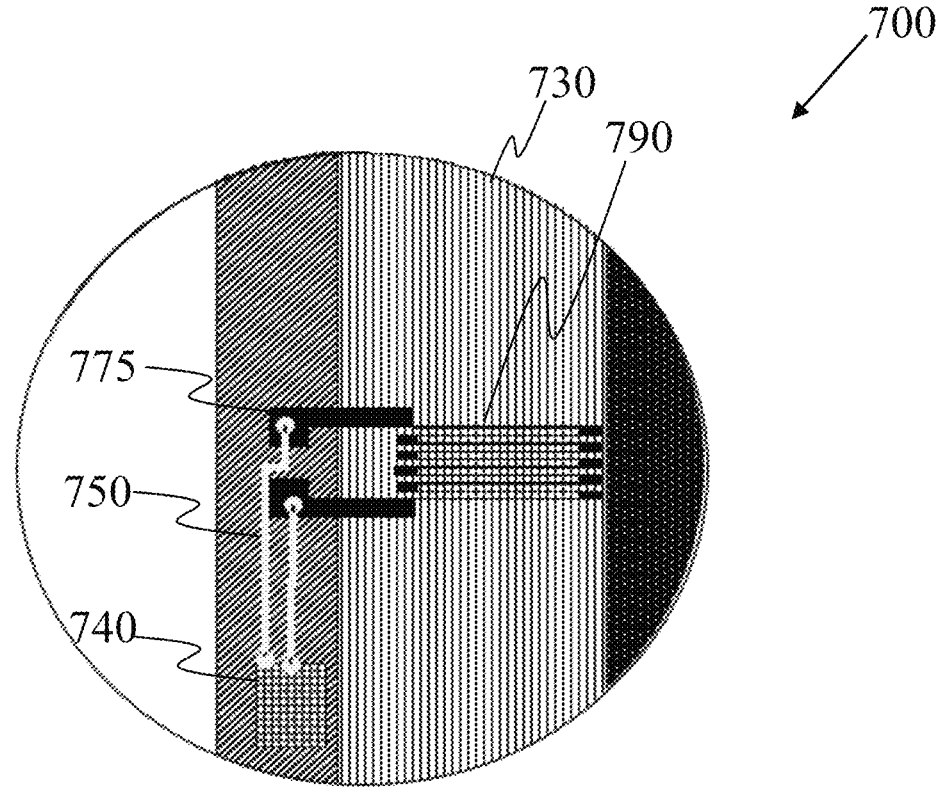
FIG. 7B shows one aspect of a reinforcement system according to the present disclosure in a top view.

With reference to FIG. 7B, according to various aspects, other means to measure deflection on the edge reinforcement 730 may include a serpentine line structure 790 (or a meandering line structure). The serpentine line structure 790 may be connected to metal electrodes 775. The metal electrodes 775 may be connected by a wire connection 750 with electrical circuitry 740. Other means to measure deflection on the edge reinforcement 730 may include a capacitive strain gauge (not shown).

Figure 8:
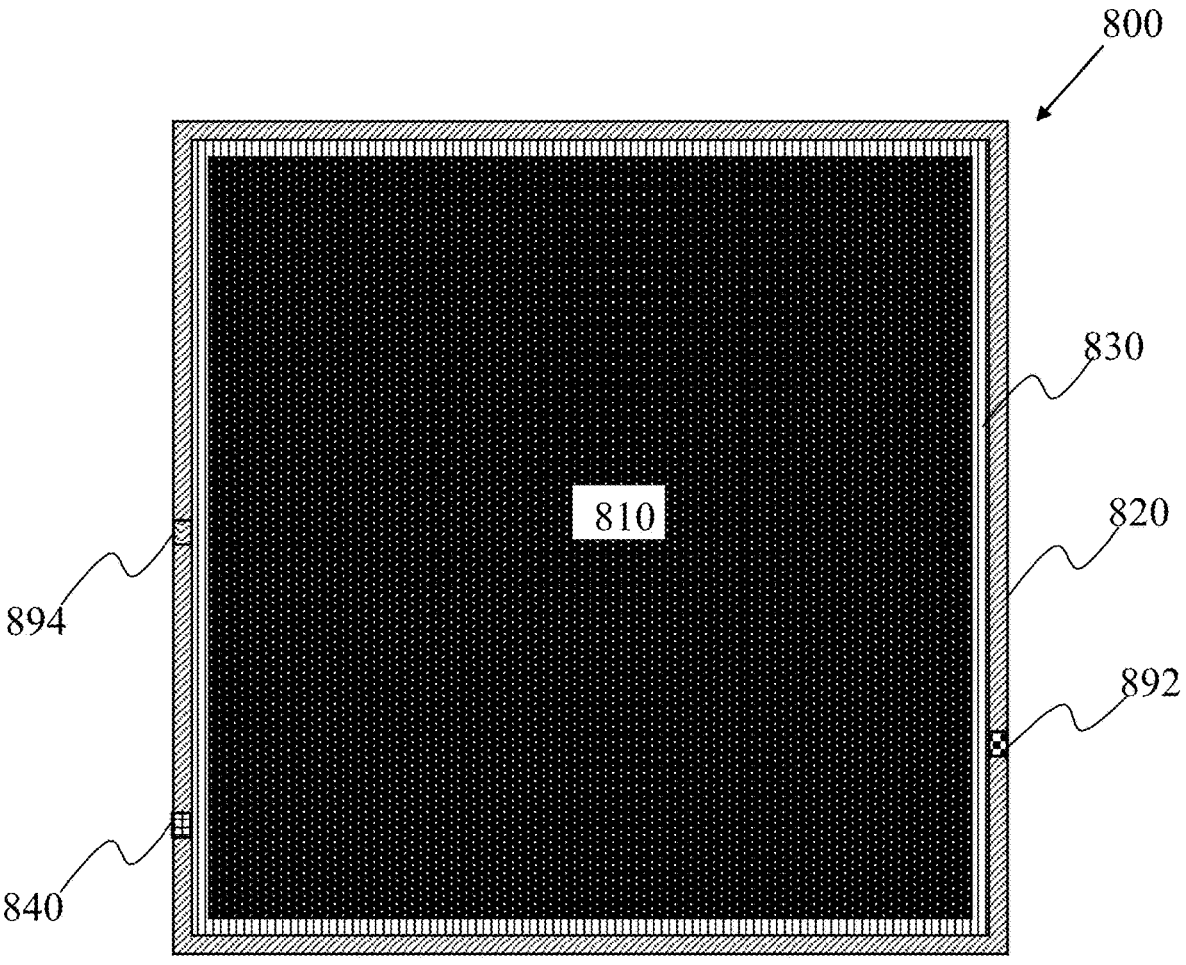
FIG. 8 shows one aspect of a reinforcement system according to the present disclosure in a top view.

According to various aspects, as illustrated in FIG. 8, the reinforcement system 800 may additionally include an accelerometer 892. The accelerometer 892 may be configured to detect motion of the framed pellicle 810. For example, the stress exerted on the framed pellicle 810 may be higher when the framed pellicle 810 is in motion, such as during transport or in the scanner. Hence, when the framed pellicle 810 is in motion, the probability of a rupture of the framed pellicle 810, including rupture of the edge reinforcement 820, is higher. The accelerometer may, in such cases, communicate to the electrical circuitry 840 to monitor a potential deflection of the framed pellicle more closely, i.e. in shorter intervals. According to some aspects, the reinforcement system 800 may additionally include a clock 894. The clock 894 may be configured to time-stamp a rupture of the framed pellicle 810. For example, in case the framed pellicle 810 ruptures, it is advantageous to obtain information about the event that caused the rupture, such that processing steps may be optimized for reducing the event that caused the rupture.

Figures 9A, 9B:
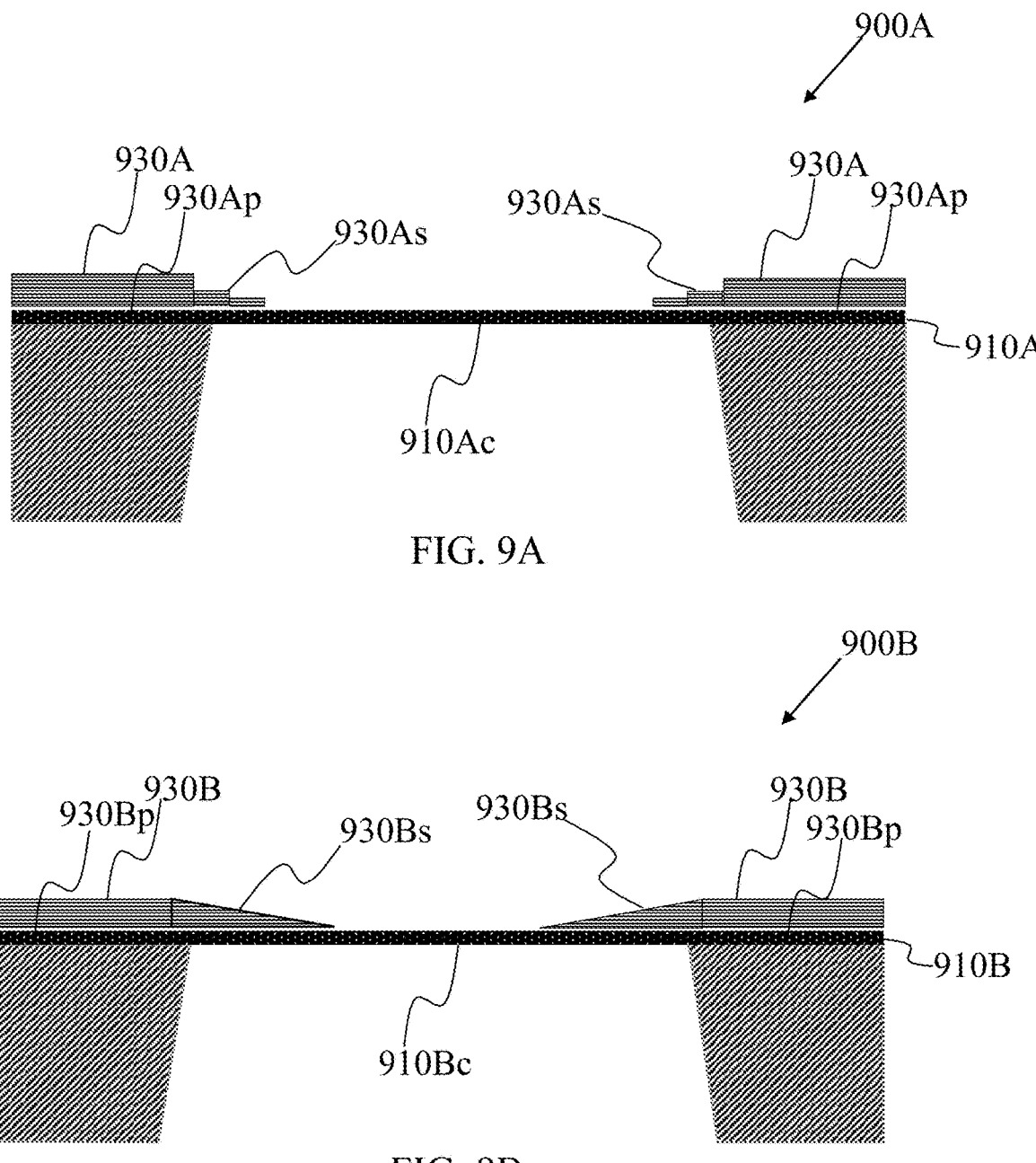
FIG. 9A schematically shows one aspect of a reinforcement system according to the present disclosure in a cross sectional view without deflection.
FIG. 9B schematically shows one aspect of a reinforcement system according to the present disclosure in a cross sectional view without deflection.

According to various aspects, as illustrated in FIG. 9A and FIG. 9B, the edge reinforcement 930A, 930B may include a slope reinforcement 930As and 930Bs, wherein the edges of the edge reinforcement 930A, 930B may be tapered towards the center portion 910Ac, 910Bc of the framed pellicle 910A, 910B. As shown in FIG. 9A, the slope reinforcement 930As may include the shape of a stepwise slope. Alternatively, and as shown in FIG. 9B, the slope reinforcement 930Bs may include the shape of a gradual slope. A point in the edge reinforcement 930A, 930B where the edge begins to taper may be at a peripheral part 910Ap, 910Bp of the framed pellicle 930A, 930B.

Figures 9C, 9D:
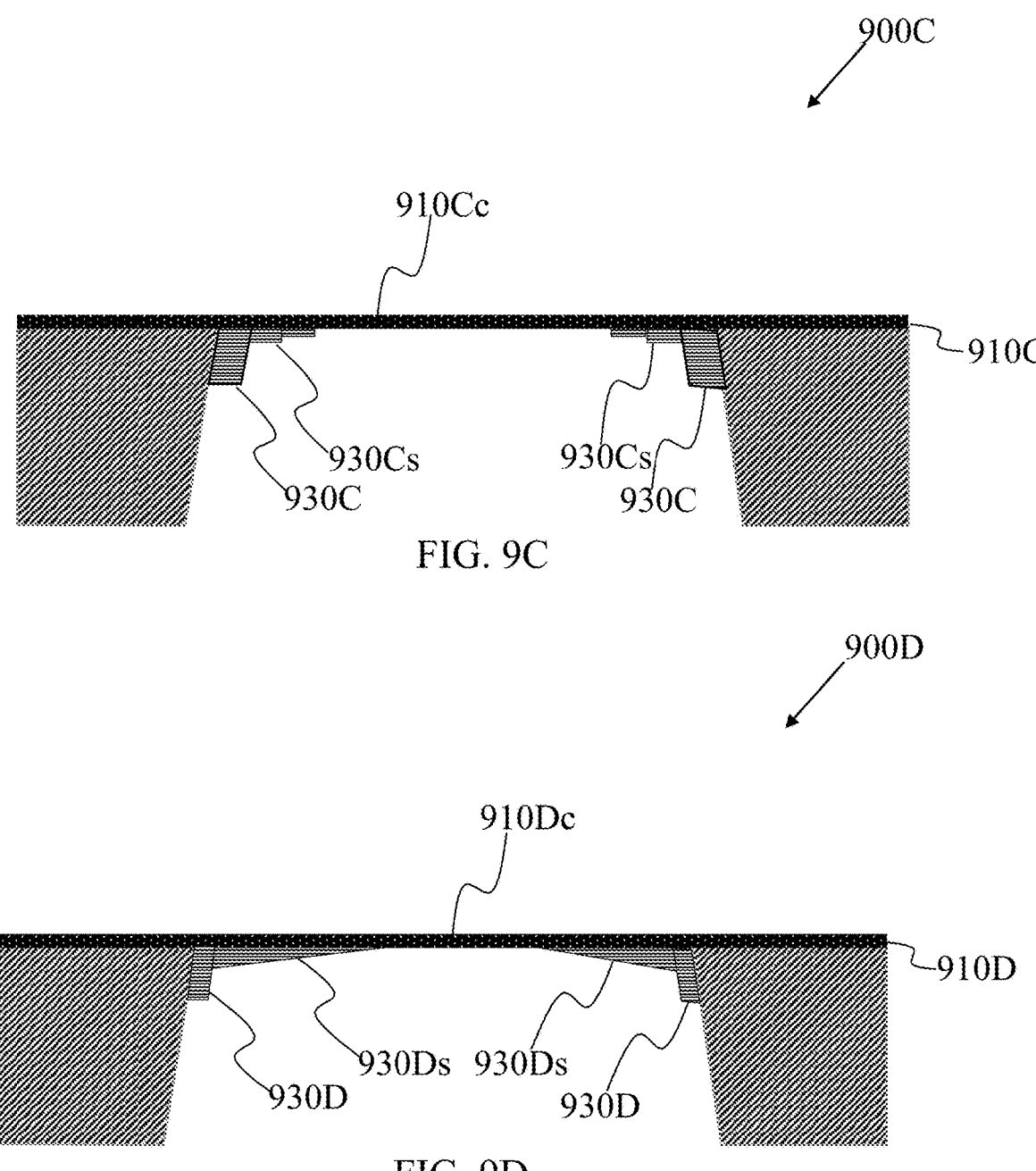
FIG. 9C schematically shows one aspect of a reinforcement system according to the present disclosure in a cross sectional view without deflection.
FIG. 9D schematically shows one aspect of a reinforcement system according to the present disclosure in a cross sectional view without deflection.

According to various aspects, as illustrated in FIG. 9C and FIG. 9D, the edge reinforcement 930C, 930D may be applied to the bottom side of the framed pellicle 910C, 910D (as shown in, e.g., FIG. 3B). Such edge reinforcement 930C, 930D may also include a slope reinforcement 930Cs and 930Ds, wherein the edges of the edge reinforcement 930C, 930D may be tapered towards the center portion 910Cc, 910Dc of the framed pellicle 910C, 910D. As shown in FIG. 9C, the slope reinforcement 930Cs may include the shape of a stepwise slope. Alternatively, and as shown in FIG. 9D, the slope reinforcement 930Ds may include the shape of a gradual slope.

In another aspect, there is provided a deflection monitoring method 1000 including providing a framed pellicle including a center part of a pellicle surrounded by a peripheral part of the pellicle, wherein the peripheral part may be adhered to a pellicle frame; and an edge reinforcement for reinforcing the framed pellicle. The edge reinforcement may be positioned at a boundary between the center part of the framed pellicle and the pellicle frame. The deflection monitoring method 1000 may further include connecting electronic circuitry to the edge reinforcement by a wire connection. The deflection monitoring method 1000 may further include arranging a means to measure deflection on the edge reinforcement. The deflection monitoring method 1000 may further include connecting the means to measure deflection to the electronic circuitry. The deflection monitoring method 1000 may further include periodically measuring a voltage generated by the means to measure deflection. The deflection monitoring method 1000 may further include detecting a pellicle deflection in the edge reinforcement by a measured increased voltage above a predetermined threshold. Advantageously, the deflection monitoring method 1000 may allow for measuring and/or recording a number of deflection events above a predetermined threshold value to predict when a framed pellicle is fatigue and continuing operation with the framed pellicle may result in failure. Additionally, the deflection monitoring method 1000 may allow for determining if a maximum deflection height has been detected. Such a maximum deflection height may indicate that the framed pellicle may be prematurely near catastrophic failure and operation with the framed pellicle may be stopped before the framed pellicle ruptures.

FIG. 10 shows a simplified flow diagram for an exemplary method according to an aspect of the present deflection monitoring method 900.

The operation 1001 may be directed to providing a framed pellicle including a center part of a pellicle surrounded by a peripheral part of the pellicle, wherein the peripheral part may be adhered to the pellicle frame and an edge reinforcement for reinforcing the framed pellicle, positioned at a boundary between the center part and the pellicle frame.

The operation 1002 may be directed to connecting an electronic circuit to the edge reinforcement by a wire connection.

The operation 1003 may be directed to arranging a deflection measure means on the edge reinforcement and connecting the deflection measure means to the electronic circuit.

The operation 1004 may be directed to periodically measuring a voltage generated by the deflection measure means.

The operation 1005 may be directed to detecting a pellicle deflection in the edge reinforcement by a measured increased voltage above a predetermined threshold.

According to various aspects, the deflection monitoring method 1000 may further include providing an external device. The external device may include, e.g., a scanner, an inspection tool, a reticle stocker, etc. The external device may activate the monitoring of the electrical continuity in the edge reinforcement. In other words, the external device may communicate to the electrical circuitry to take control of sampling the deflection in the framed pellicle.

According to various aspects, the deflection monitoring method 1000 may further include providing an accelerometer. The accelerometer may detect whether the framed pellicle is in motion and adjust a sampling frequency, in other words, the interval at which the deflection of the framed pellicle is measured.

In another aspect, there is provided a rupture determination method 1100 including providing a framed pellicle. The framed pellicle may include a center part of a pellicle surrounded by a peripheral part of the pellicle, wherein the peripheral part may be adhered to the pellicle frame and an edge reinforcement for reinforcing the framed pellicle. The edge reinforcement may be positioned at a boundary between the center part and the pellicle frame. The rupture determination method 1100 may further include connecting electronic circuitry to the edge reinforcement by a wire connection or other suitable means such as a metal interconnect embedded in a Silicon frame assembly during fabrication. The rupture determination method 1100 may further include monitoring an electrical continuity in the edge reinforcement by the electronic circuitry. The rupture determination method 1100 may further include detecting a pellicle rupture in the edge reinforcement by detection of an interrupted electronic circuit. Advantageously, by carrying out the rupture determination method, it may be possible to immediately detect a rupture in the framed pellicle during the production process. Hence, any pellicle failures may be detected at the time when the failure occurs and operation with the ruptured pellicle may be stopped before any further damage is caused. Therefore, operational inefficiency attributed to ruptured pellicles and late detection of such ruptured pellicles may be avoided.

FIG. 11 shows a simplified flow diagram for an exemplary method according to an aspect of the present rupture determination 1100.

The operation 1101 may be directed to providing a framed pellicle including: a center part of a pellicle surrounded by a peripheral part of the pellicle, wherein the peripheral part may be adhered to the pellicle frame; and an edge reinforcement for reinforcing the framed pellicle, positioned at a boundary between the center part and the pellicle frame.

The operation 1102 may be directed to connecting an electronic circuit to the edge reinforcement by a wire connection.

The operation 1103 may be directed to monitoring an electrical continuity in the edge reinforcement by the electronic circuit.

The operation 1104 may be directed to detecting a pellicle rupture in the edge reinforcement by detection of an interrupted electronic circuit.

According to various aspects, the rupture determination method 1100 may further include communicating the pellicle rupture in the edge reinforcement to an external device. The external device may include, e.g., a scanner, an inspection tool, a reticle stocker, etc. The external device may stop the ruptured pellicle from being further processed. According to various aspects, the rupture determination method 1100 may further include using a clock for putting a time stamp on the rupture of the framed pellicle.

Figure 12:
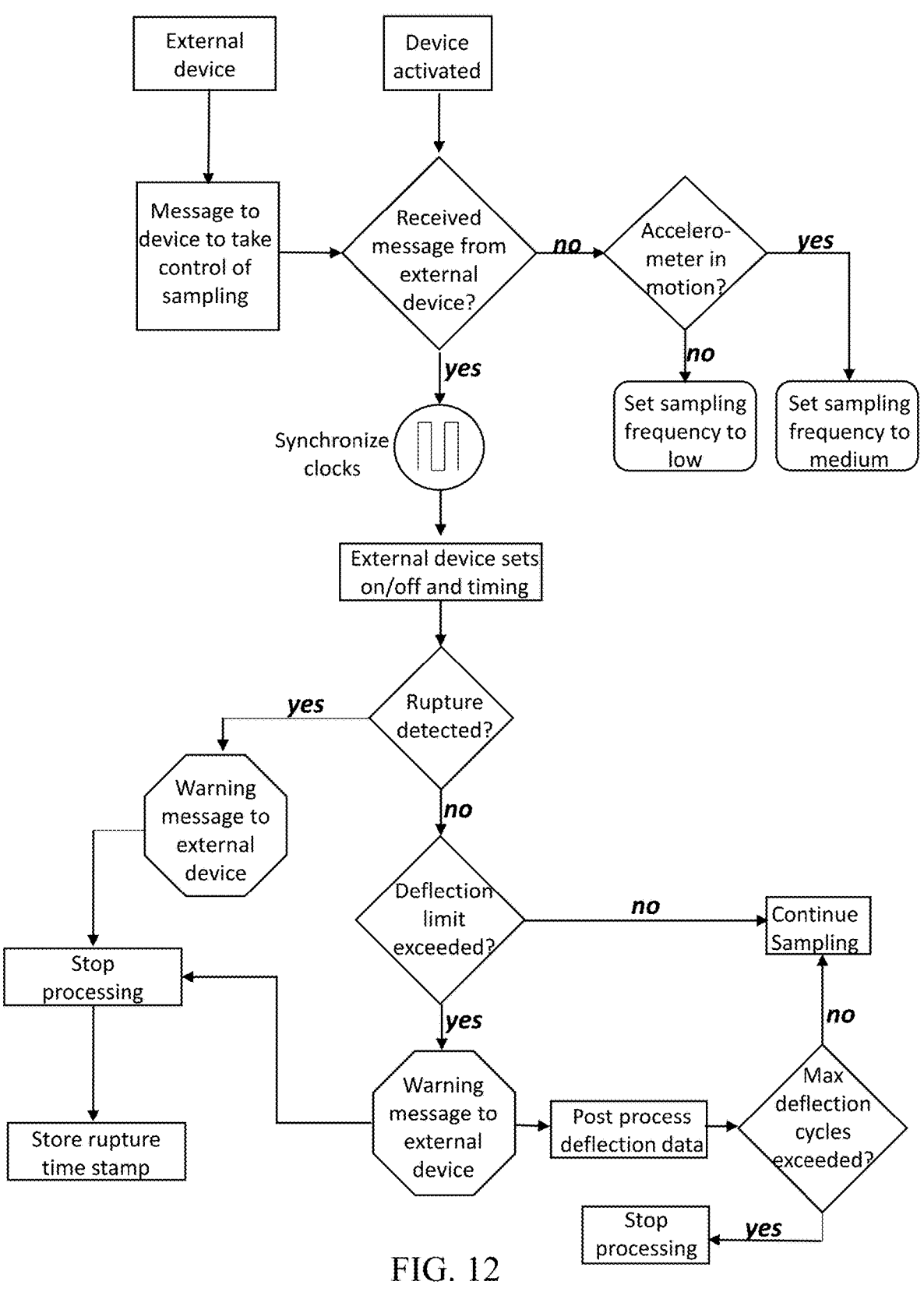
FIG. 12 shows a decision tree for carrying out methods according to several aspects of the present disclosure.

With regard to FIG. 12, in some aspects of the present disclosure, there is provided a combination between the method 1000 and the method 1100. The combined method may involve a device (e.g., electrical circuitry on a pellicle frame) being activated. For example, the device may receive a message from an external device (e.g., a scanner, an inspection tool, a reticle stocker, etc.) to take control of sampling (e.g., measuring the deflection of a framed pellicle). In case the device is not activated by the external device, the device may determine whether an accelerometer is in motion (e.g., determine whether the pellicle together with the accelerometer is in motion). In case the accelerometer is in motion, a sampling frequency is set to a medium sampling frequency. In case the accelerometer is not in motion, the sampling frequency is set to a low sampling frequency. If the device is activated by the external device, the device may synchronize the device's clock with the clock of the external device. Subsequently, the external device may set an on and off timing for the device. In case a rupture is detected, a warning message may be sent from the device to the external device. In that case, processing may be stopped and the time of the rupture may be stored. In case a rupture is not detected, the device may determine whether a deflection limit is exceeded. In case a deflection limit is not exceeded, the device may continue sampling. In case a deflection limit is exceeded, the device may send a warning message to the external device. After receiving a warning message, the process may be stopped and the time of the rupture may be stored. Additionally or alternatively, the deflection data may be post processed. After post processing of the deflection data, it is determined whether the maximum deflection cycles are exceeded. In case the maximum deflection cycles are exceeded, processing is stopped. In case the maximum deflection cycles are not exceeded, sampling is continued.

In a first example, there is provided a reinforcement system including: a framed pellicle including: a center part of a pellicle surrounded by a peripheral part of the pellicle, wherein the peripheral part may be adhered to a pellicle frame; and an edge reinforcement for reinforcing the framed pellicle, positioned at a boundary between the center part of the framed pellicle and the pellicle frame.

In a second example, the edge reinforcement of example 1 may be positioned on a top side of the framed pellicle such that it contacts the peripheral part of the pellicle and the center portion of the pellicle.

In a third example, a thickness of the edge reinforcement of example 1 or example 2 may be greater than 5 times a thickness of the pellicle.

In a fourth example, the edge reinforcement of any of the examples 1 to 3 may further include four corner reinforcements, the four corner reinforcements having an interior curved section.

In a fifth example, the edge reinforcement at the four corner reinforcements of example 4 may be thicker than sections of the edge reinforcement between the four corner reinforcements.

In a sixth example, the edge reinforcement of any of the examples 1 to 5 may further include a conductive material selected from the group consisting of a doped polysilicon, a doped single crystal silicon, a metal, a semiconductor, a metal alloy, or combinations thereof.

In a seventh example, the system of any one of the examples 1 to 6 may include electronic circuitry connected to the edge reinforcement by a wire connection configured to monitor electrical continuity in the edge reinforcement and detecting a rupture in the framed pellicle.

In an eighth example, the system of example 7 may include a piezoelectric element between metal electrodes that are configured to be in contact with the edge reinforcement and connected to the electronic circuitry.

In a ninth example, the system of example 7 may include a serpentine line structure positioned in the edge reinforcement, wherein the serpentine line structure may be configured to detect deflection of the pellicle.

In a tenth example, the system of example 7 may include a capacitive strain gauge positioned in the edge reinforcement, wherein the capacitive strain gauge may be configured to detect deflection of the pellicle.

In an eleventh example, the system of any one of the examples 7 to 10 may include an accelerometer connected to the framed pellicle, wherein the accelerometer may be configured to detect motion.

In a twelfth example, the system of any one of the examples 7 to 11 may include a clock configured to record the time of the rupture in the electrical continuity.

In a thirteenth example, there is provided a deflection monitoring method including: providing a framed pellicle including: a center part of a pellicle surrounded by a peripheral part of the pellicle, wherein the peripheral part may be adhered to a pellicle frame; and an edge reinforcement for reinforcing the framed pellicle, positioned at a boundary between the center part of the framed pellicle and the pellicle frame; connecting electronic circuitry to the edge reinforcement by a wire connection; providing a deflection measure means on the edge reinforcement and connecting the deflection measure means to the electronic circuitry; periodically measuring a voltage generated by the deflection measure means; and detecting a pellicle deflection in the edge reinforcement by a measured increased voltage above a predetermined threshold.

In a fourteenth example, the deflection monitoring method of example 13 may include providing an external device that may be configured to activate the monitoring of the electrical continuity in the edge reinforcement.

In a fifteenth example, the deflection monitoring method of example 13 or example 14 may include an accelerometer that may be configured to determine whether the pellicle is in motion and adjusting an interval at which the voltage is measured to the determined motion.

In a sixteenth example, the deflection measure means on the edge reinforcement of any one of examples 13 to 15 may include a piezoelectric element, a serpentine line structure, a capacitive strain gauge and/or combinations thereof.

In a seventeenth example, the deflection monitoring method of any one of examples 13 to 16 may include communicating the detection of the pellicle deflection to an external computer.

In an eighteenth example, there is provided a rupture determination method including: providing a framed pellicle including: a center part of a pellicle surrounded by a peripheral part of the pellicle, wherein the peripheral part may be adhered to the pellicle frame; and an edge reinforcement for reinforcing the framed pellicle, positioned at a boundary between the center part and the pellicle frame; connecting electronic circuitry to the edge reinforcement by a wire connection; monitoring an electrical continuity in the edge reinforcement by the electronic circuitry; and detecting a pellicle rupture in the edge reinforcement by detection of an interrupted electronic circuit.

In a nineteenth example, the rupture determination method of example 18 may include communicating the pellicle rupture in the edge reinforcement to an external device.

In a twentieth example, the rupture determination method of example 18 or example 19 may include providing a clock and communicating the time of the pellicle rupture in the edge reinforcement to the external device.

The properties of the reinforcement system and the choice of method steps presented above are intended to be exemplary for the process. It will be apparent to those ordinary skilled practitioners that the foregoing process operations may be modified without departing from the spirit of the present disclosure.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

By "about" and "approximately" in relation to a given numerical value, such as for thickness and height, it is meant to include numerical values within 10% of the specified value.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

The invention claimed is:

1. A reinforcement system comprising:
a framed pellicle comprising:
a center part of a pellicle surrounded by a peripheral part of the pellicle, wherein the peripheral part is adhered to a pellicle frame;
an edge reinforcement for reinforcing the framed pellicle, positioned at a boundary between the center part of the pellicle and the pellicle frame; and

electronic circuitry disposed on or in the pellicle frame and connected to the edge reinforcement by a wire connection configured to monitor electrical continuity in the edge reinforcement and detect a rupture in the framed pellicle, wherein the wire connection is disposed, at least partially, on or in the edge reinforcement.

2. The reinforcement system of claim 1, wherein the edge reinforcement is positioned on a top side of the framed pellicle such that it contacts the peripheral part of the pellicle and the center part of the pellicle.

3. The reinforcement system of claim 1, wherein a thickness of the edge reinforcement is greater than 5 times a thickness of the pellicle.

4. The reinforcement system of claim 1, wherein the edge reinforcement further comprises four corner reinforcements, the four corner reinforcements having an interior curved section.

5. The reinforcement system of claim 4, wherein the edge reinforcement at the four corner reinforcements is thicker than sections of the edge reinforcement between the four corner reinforcements.

6. The reinforcement system of claim 1, wherein the edge reinforcement further comprises a conductive material selected from the group consisting of a doped polysilicon, a doped single crystal silicon, a metal, a semiconductor, a metal alloy, or combinations thereof.

7. The reinforcement system of claim 6, further comprising a piezoelectric element between metal electrodes that are configured to be in contact with the edge reinforcement and connected to the electronic circuitry.

8. The reinforcement system of claim 6, further comprising a serpentine line structure positioned in the edge reinforcement, wherein the serpentine line structure is configured to detect deflection of the pellicle.

9. The reinforcement system of claim 6, further comprising a capacitive strain gauge positioned in the edge reinforcement, wherein the capacitive strain gauge is configured to detect deflection of the pellicle.

10. The reinforcement system of claim 6, further comprising an accelerometer connected to the framed pellicle, wherein the accelerometer is configured to detect motion.

11. The reinforcement system of claim 6, further comprising a clock configured to record the time of the rupture in the electrical continuity.

12. A deflection monitoring method comprising:
providing a framed pellicle comprising:
a center part of a pellicle surrounded by a peripheral part of the pellicle, wherein the peripheral part is adhered to a pellicle frame; and
an edge reinforcement for reinforcing the framed pellicle, positioned at a boundary between the center part of the pellicle and the pellicle frame;
connecting electronic circuitry to the edge reinforcement by a wire connection;
providing a deflection measure means on the edge reinforcement and connecting the deflection measure means to the electronic circuitry;
periodically measuring a voltage generated by the deflection measure means; and
detecting a pellicle deflection in the edge reinforcement by a measured increased voltage above a predetermined threshold.

13. The method of claim 12, further comprising providing an external device that is configured to activate the monitoring of the electrical continuity in the edge reinforcement.

14. The method of claim 12, further comprising an accelerometer that is configured to determine whether the pellicle is in motion and adjusting an interval at which the voltage is measured to the determined motion.

15. The method of claim 12, wherein the deflection measure means on the edge reinforcement comprise a piezo-electric element, a serpentine line structure, a capacitive strain gauge and/or combinations thereof.

16. The method of claim 12, further comprising communicating the detection of the pellicle deflection to an external computer.

17. A rupture determination method comprising:

providing a framed pellicle comprising:

a center part of a pellicle surrounded by a peripheral part of the pellicle, wherein the peripheral part is adhered to the pellicle frame; and

14 an edge reinforcement for reinforcing the framed pellicle, positioned at a boundary between the center part of the pellicle and the pellicle frame;

connecting electronic circuitry to the edge reinforcement by a wire connection, wherein the electronic circuitry is disposed on or in the pellicle frame, wherein the wire connection is disposed, at least partially, on or in the edge reinforcement;

monitoring an electrical continuity in the edge reinforcement by the electronic circuitry; and detecting a pellicle rupture in the edge reinforcement by detection of an interrupted electronic circuit.

18. The method of claim 17, further comprising communicating the pellicle rupture to an external device.

19. The method of claim 18, further comprising providing a clock and communicating the time of the pellicle rupture to the external device.

*    *    *    *    *